United States Patent
Shao et al.

(10) Patent No.: US 8,122,327 B2
(45) Date of Patent: *Feb. 21, 2012

(54) SYMBOL-LEVEL SOFT OUTPUT VITERBI ALGORITHM (SOVA) AND A SIMPLIFICATION ON SOVA

(75) Inventors: Rose Shao, Shrewsbury, MA (US); Ara Patapoutian, Westborough, MA (US)

(73) Assignee: Seagate Technology LLC, Cupertino, CA (US)

( * ) Notice: Subject to any disclaimer, the term of this patent is extended or adjusted under 35 U.S.C. 154(b) by 1308 days.

This patent is subject to a terminal disclaimer.

(21) Appl. No.: 11/751,978

(22) Filed: May 22, 2007

(65) Prior Publication Data

US 2007/0220409 A1    Sep. 20, 2007

Related U.S. Application Data

(62) Division of application No. 10/680,264, filed on Oct. 7, 2003, now Pat. No. 7,237,180.

(51) Int. Cl.
    *H03M 13/00*    (2006.01)
(52) U.S. Cl. .......................... 714/778; 714/780
(58) Field of Classification Search .......... 714/791–792, 714/794–796, 756, 784; 375/341, 262, 265
    See application file for complete search history.

(56) References Cited

U.S. PATENT DOCUMENTS

| | | | |
|---|---|---|---|
| 5,278,846 A | 1/1994 | Okayama et al. | |
| 5,742,620 A | 4/1998 | Iwamura | |
| 5,757,821 A | 5/1998 | Jamal et al. | |
| 5,875,199 A | 2/1999 | Luthi | |
| 5,968,198 A | 10/1999 | Hassan et al. | |
| 6,381,726 B1 | 4/2002 | Weng | |
| 6,445,755 B1 | 9/2002 | Chung et al. | |
| 6,581,182 B1 * | 6/2003 | Lee | 714/795 |
| 6,587,987 B1 | 7/2003 | Vasic et al. | |
| 6,976,203 B2 | 12/2005 | Kurtas et al. | |
| 7,031,090 B2 * | 4/2006 | Ichihara et al. | 360/65 |
| 2003/0101410 A1 * | 5/2003 | Betti et al. | 714/794 |

OTHER PUBLICATIONS

Swaszek et al., "How Often is Hard-Decision Decoding Enough?", IEEE Transactions on Information Theory, vol. 44, No. 3, May 1998, pp. 1187-1193.

Joachim Hagenauer, Elke Offer and Lutz Papke, "Iterative Decoding of Binary Block and Convolutional Codes," Transactions on Information Theory, vol. 42, No. 12, Mar. 1996, p. 429-445.

Joachim, Hagenauer and Peter Hoeher, "A Viterbi Algorithm With Soft-Decision Outputs and its Applictions," IEEE, 1989, pp. 1680-1686.

* cited by examiner

*Primary Examiner* — Guy Lamarre
(74) *Attorney, Agent, or Firm* — Alan G. Rego; Westman, Champlin & Kelly, P.A.

(57) ABSTRACT

A method and apparatus for processing symbols of a block code is presented. A sequence of symbols is received, e.g., from an inter-symbol interference (ISI) channel. A soft value is determined for each symbol using a binary trellis.

14 Claims, 10 Drawing Sheets

SYMBOL-LEVEL SOFT OUTPUT VITERBI ALGORITHM (SOVA) AND A SIMPLIFICATION ON SOVA

CROSS-REFERENCE TO RELATED APPLICATIONS

The present application is a divisional of commonly assigned application Ser. No. 10/680,264 filed Oct. 7, 2003, now U.S. Pat. No. 7,237,180, which was issued on Jun. 26, 2007 to Shao et al., entitled SYMBOL-LEVEL SOFT OUTPUT VITERBI ALGORITHM (SOYA) AND A SIMPLIFICATION ON SOVA, which is hereby incorporated by reference in its entirety.

BACKGROUND OF THE INVENTION

1. Field of the Invention

The invention relates to the use of the soft output Viterbi algorithm (SOVA) in data transmission systems.

2. Background Information

Many data transmission systems use a soft detector to generate for error correction code inputs both hard (1 or 0) decisions and corresponding confidence levels (referred to as "soft decisions"). The soft detector allows a decoder to achieve better decoding performance than would be possible if the decoder were to receive as input hard decisions only. Examples of soft detectors include maximum a-posteriori probability (MAP) detectors and soft output Viterbi algorithm (SOVA) detectors.

When a non-binary code over $GF(2^q)$ where $q>1$, for example, a Reed Solomon code, is used for error correction purposes, each q-bits in the codeword is treated as a symbol. Thus, for such a code, a soft detector must be capable of delivering symbol-level hard and soft decisions. The processing of the MAP detector, though capable of delivering symbol-level soft values, is extremely time-consuming and complex, as it considers $2^q$ possible candidates for each symbol position. The known SOVA detectors, while less complex than the MAP detectors, operate only at the bit-level.

SUMMARY OF THE INVENTION

This invention features a symbol-level soft output Viterbi algorithm (SOVA).

In one aspect of the invention, processing symbols of a block code includes receiving a sequence of symbols in the block code and determining a soft value for each symbol using a binary trellis.

Particular implementations of the invention may provide one or more of the following advantages. The symbol-level SOVA provides symbol-level soft value for each symbol position with much less computation and memory requirement than the symbol-level MAP. For a Generalized Minimum Distance (GMD) soft decoder, the symbol-level SOVA does not degrade the error performance at all. For the Algebraic Soft Decoder (ASD), the symbol-level SOVA provides very little performance degradation compared with the symbol-level MAP in some applications.

Other features and advantages of the invention will be apparent from the following detailed description, and from the claims.

BRIEF DESCRIPTION OF THE DRAWINGS

Like reference numerals will be used to represent like elements.

DETAILED DESCRIPTION OF AN ILLUSTRATIVE EMBODIMENT

Figure 1:
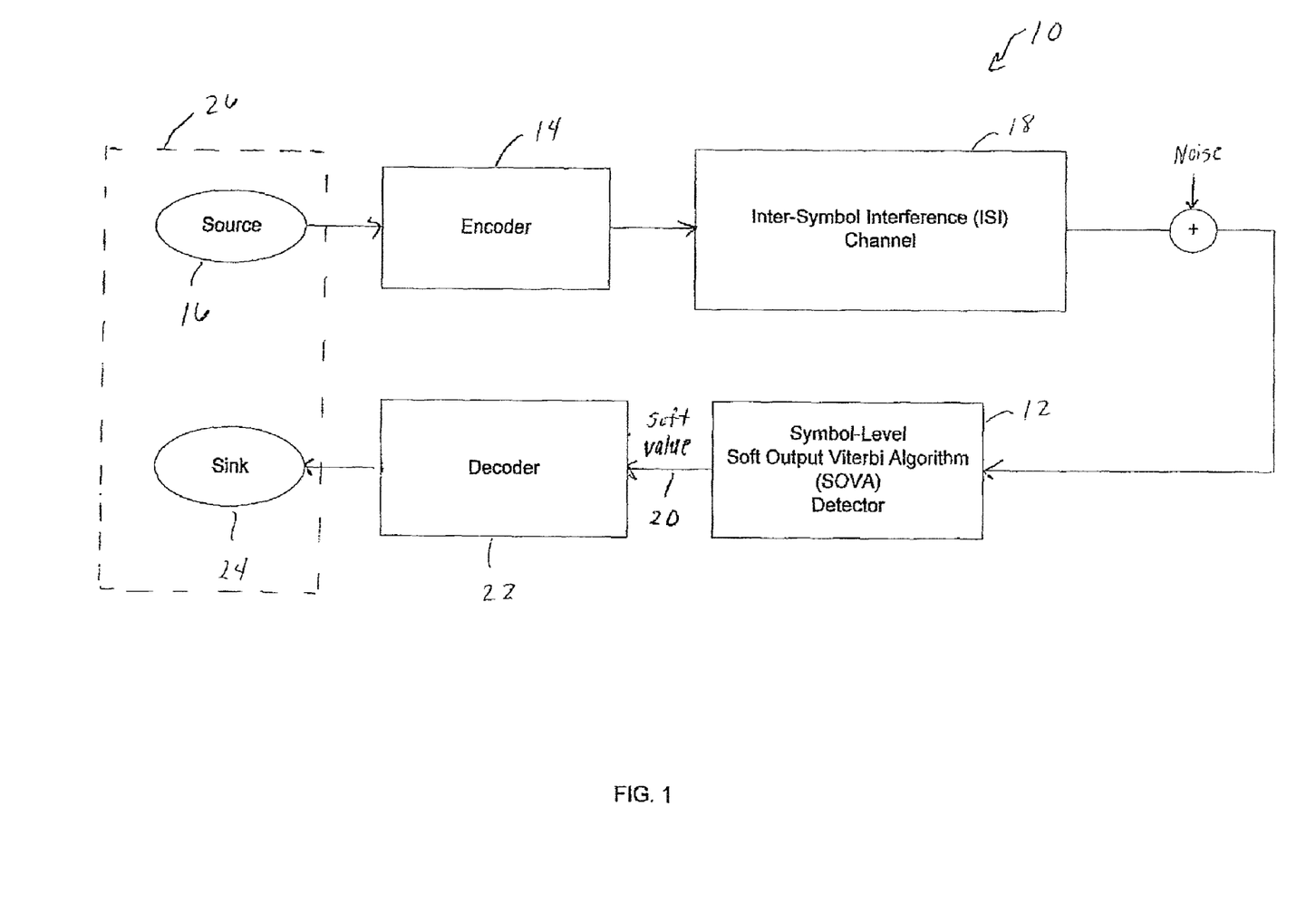
FIG. 1 is a high-level block diagram of a data transmission system that employs a symbol-level soft output Viterbi algorithm (SOVA) detector to provide symbol-level soft values for symbols in a non-binary error correction code.

Referring to FIG. 1, a data transmission system 10 that uses a symbol-level soft output Viterbi algorithm (SOVA) detector 12 during decoding is shown. The data transmission system 10 includes an encoder 14 that receives user bits U from a data source 16. The encoder 14 encodes the user bits and provides the encoded data to a channel with memory such as an inter-symbol interference (ISI) channel 18. The encoded data is in the form of a non-binary error correction code (ECC) in which bits are grouped into "symbols". The symbol-level SOVA detector 12 processes the encoded data as received from the ISI channel 18 to produce a soft output (or soft value) 20 that includes hard decisions and soft decisions for each symbol in the encoded data. As used herein, the term "hard decision" refers to bit or symbol decisions of the SOVA detector and the term "soft decision" refers to magnitudes of likelihood or probability values of the corresponding decisions. The symbol-level SOVA detector 12 is followed by a decoder 22, which uses the output of the symbol-level SOVA detector 12 to generate the decoded user bits U, which are provided to a data sink 24. In one embodiment, the ISI channel 18 is a magnetic recording channel 18, and the source and sink are, for example, part of a data processing system 26, as shown. In a storage application environment, the code may be a non-binary block code over $GF(2^q)$ where $q>1$, for example, a Reed-Solomon code. In a storage media or other application environment, the code may be any type of code that requires symbol-level detection or decoding. In a convolutional coding application, the ISI channel 18 would be replaced by a convolutional encoder and the symbol-level SOVA detector 12 would be replaced by a symbol-level SOVA decoder for convolutional decoding. In general, the symbol-level SOVA technique and the simplified SOVA (bit or symbol level), to be described in detail below, may be applicable to any application in which the Viterbi algorithm is used.

Figure 2:
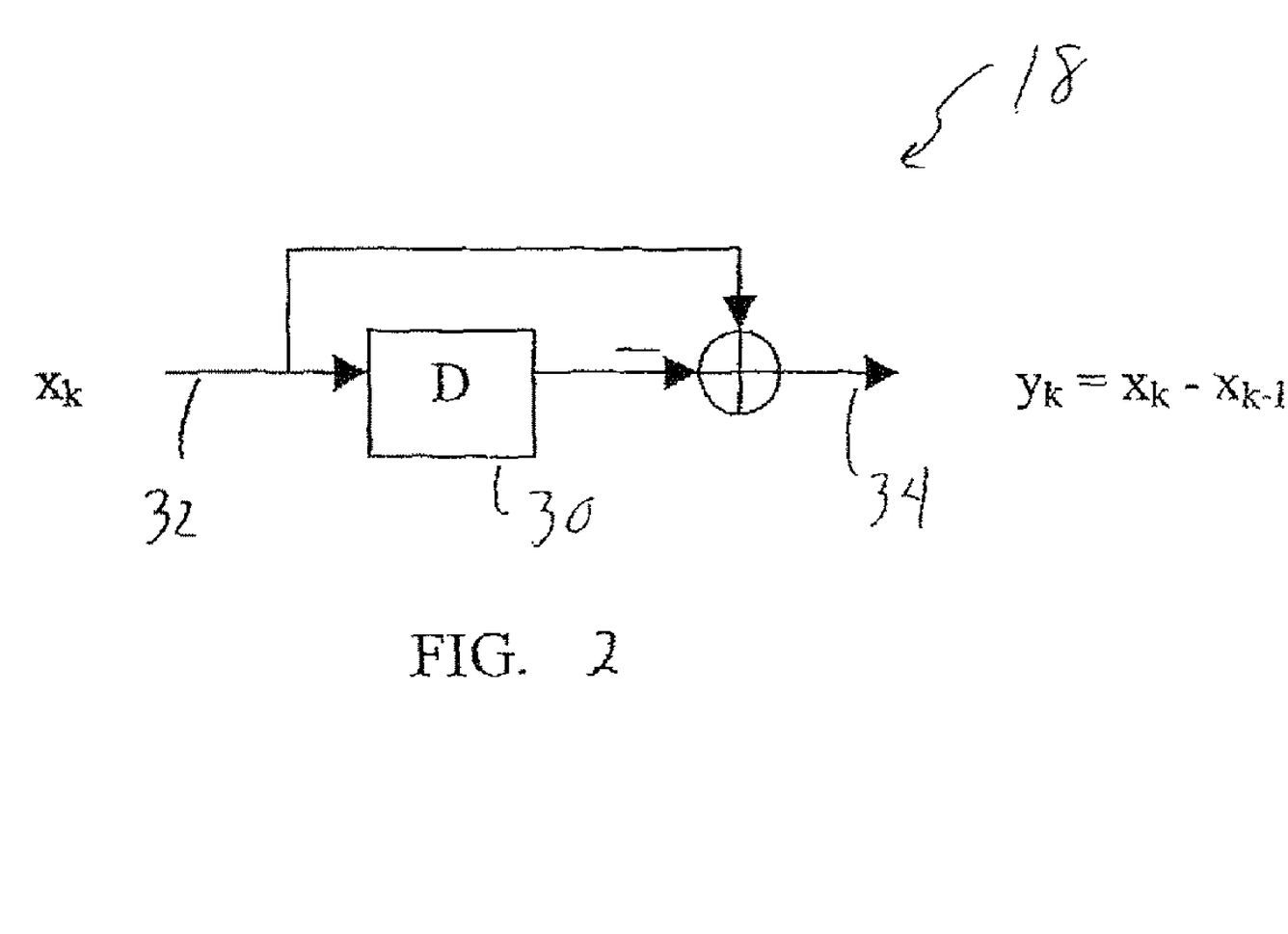
FIG. 2 is a depiction of an exemplary inter-symbol interference (ISI) channel having a memory order of one.

Referring now to FIG. 2, a representation of the channel 18 as having a 1-D target with memory order m=1 (single memory delay D) 30 is shown. An encoded binary data sequence $\{a_k\}$ is written as a sequence $\{x_k\}$ 32 of '−1' and '+1'. An expected noiseless readback sequence $\{y_k\}$ 34 is generated from $x_k$ where $x_k=2*a_k-1$.

Figure 3:
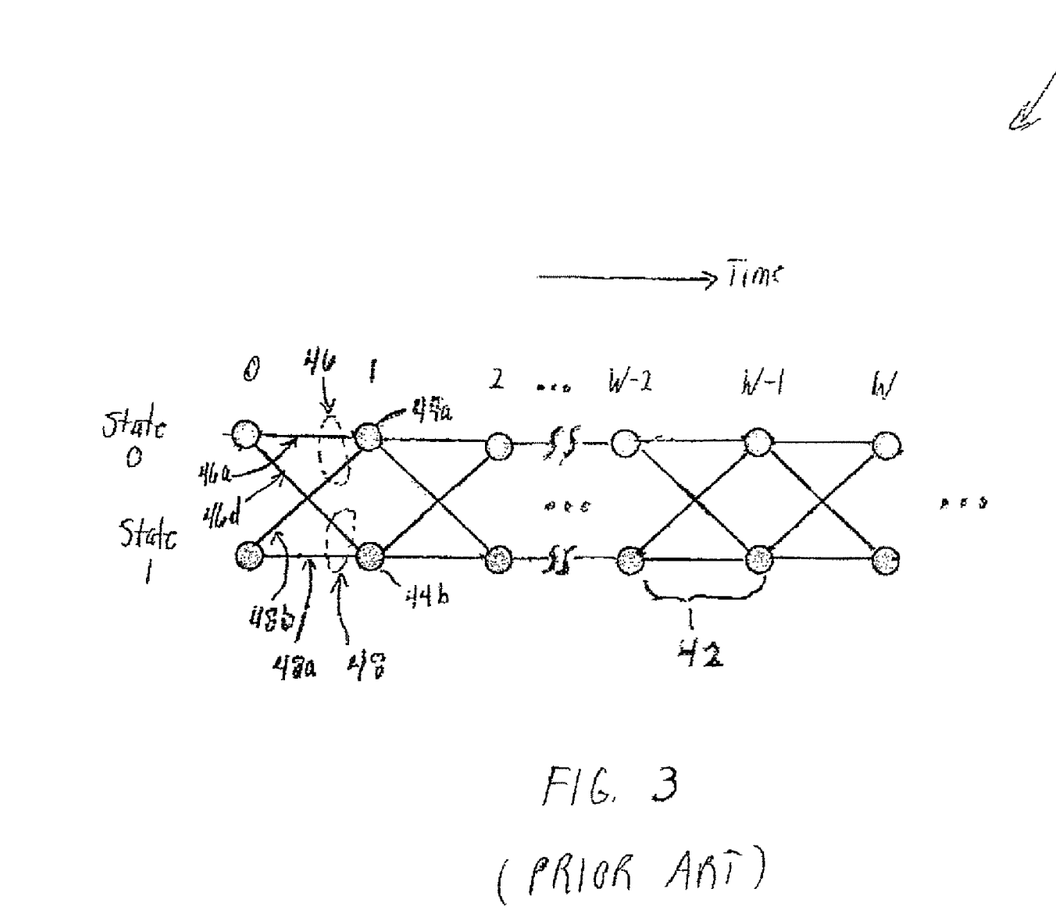
FIG. 3 is a depiction of an exemplary binary trellis.

More generally, with memory order m, the channel 18 can be represented by a trellis (or trellis diagram) of $2^m$ states. Each state represents the delayed input bits. Referring to FIG. 3, an exemplary trellis 40 of the channel 18 (from FIG. 2) having two states, "state 0" and "state 1", is shown. With a channel target 1-D, a data block of N bits and corresponding noiseless readback sequence can be represented by a path in the trellis where the trellis is composed of N sections (or stages) 42. Typically, a SOVA operates on a window W of trellis sections at a time. For each time k (where k is an integer value from 0 to W) or trellis section k, the trellis 40 includes two state nodes $s_k$, for example, at k=1, a state node 44a corresponding to state 0 and a state node 44b corresponding to state 1. Each state node 44 has two incoming branches. For state 0, incoming branches 46 include branches 46a and 46b. For state 1, incoming branches 48 include branches 48a and 48b.

Figure 4:
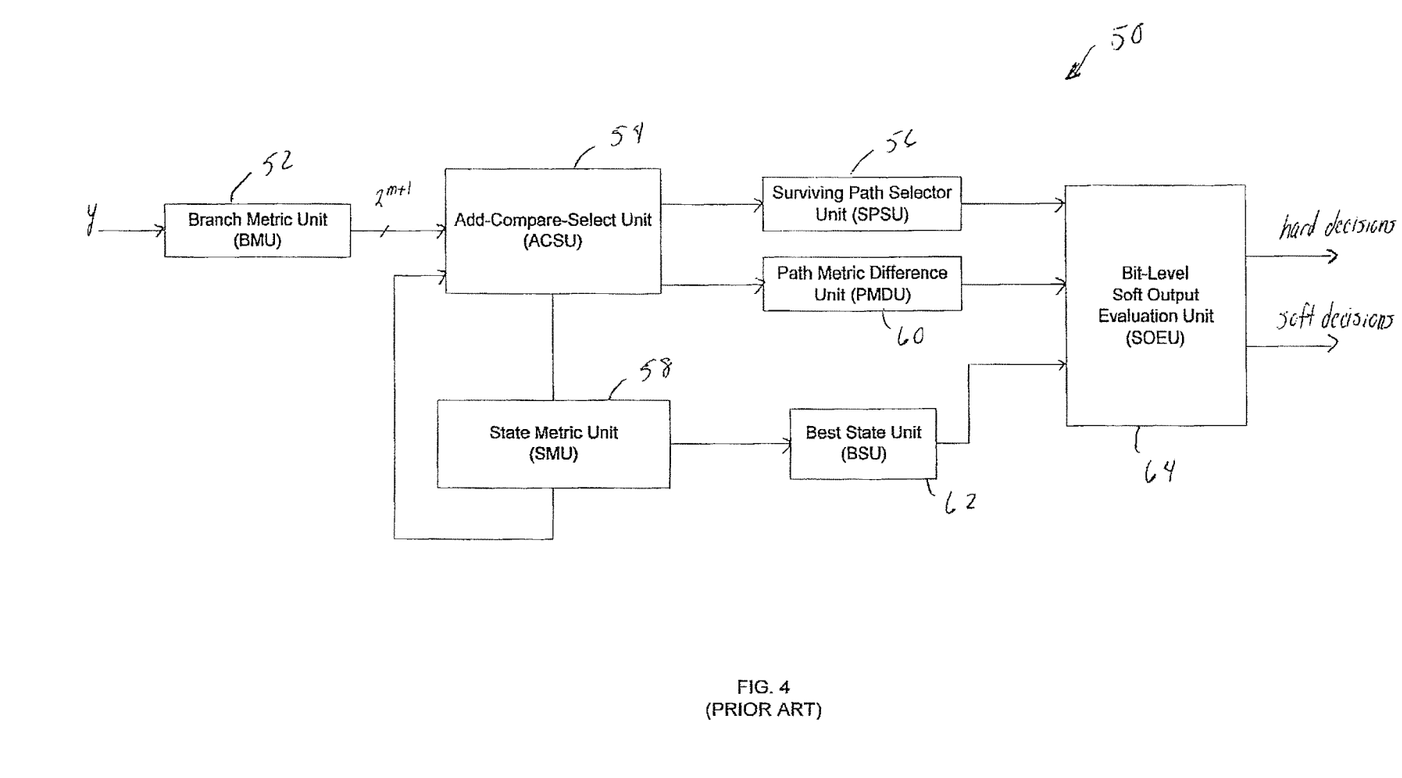
FIG. 4 is a block diagram of an exemplary bit-level SOVA detector.

Referring to FIG. 4, an exemplary conventional bit-level SOVA detector 50 that computes soft decision values as well as hard decision values given a sequence of noisy readback samples is shown. The bit-level SOVA detector 50 can be a windowed detector having a window size of W where W is chosen to be greater than the path convergence length L, and L may be 4 to 5 times the memory order m of the memory channel. Generally, the bit-level SOVA detector 50 includes the following functional blocks: a branch metric unit (BMU) 52; an add-compare-select unit (ACSU) 54; a surviving path selector unit (SPSU) 56; a state metric unit (SMU) 58; a path metric difference unit (PMDU) 60; a best state unit (BSU) 62; and a soft output evaluation unit (SOEU) 64.

Referring to FIG. 4 in conjunction with FIG. 3, the BMU 52 receives each bit sample at time k from the channel and calculates for the sample four branch metrics, e.g., the Euclidean distance between the received noisy sample and each of the four possible expected outputs (associated with the branches 46a, 46b and 48a, 48b). The ACSU 54 computes path metrics for the two incoming branches 46a, 46b and 48a, 48b for state 0 and state 1, respectively, at current time k by adding state metrics at time k−1 with the corresponding branch metrics, comparing the two resultant path metrics for each state, and selecting the smaller one as the surviving path metric (or state metric) for that state at time k. Selectors for the surviving paths (for the two states at time k) are stored in the SPSU 56. The state metrics for both states at time k are stored in the SMU 58 and are fed back (or otherwise made available) to the ACSU 54 for determination of state metrics at time k+1. The path metric difference, that is, the difference between the incoming path metrics, at each state is recorded in the PMDU 60. The state metrics, surviving paths and path metric difference values are determined for each trellis section (corresponding to state transitions from states at time k−1 to states at time k) within the window W. It will be appreciated that the units 56, 60 and 62 are storage areas, and thus could reside in an external memory device.

Once all of the state metrics within W are available, the BSU 62 finds the best state with the smallest state metric among all the states. Thus, before W trellis sections are processed, the BSU 62 is idle. When the SPSU 56 and the PMDU 60 are filled up at time W, the BSU 62 compares all of the state metrics and provides as an output the best state (that is, the state with the smallest state metric). Using the best state chosen by BSU 62 at time W, and surviving path selectors stored for times k=1 to W in the SPSU 56, the SOEU 64 performs traceback operations to find the hard decisions on the ML path for the window W and the competing paths along the ML path for the window W. The path metric differences along the ML path, path metric differences "D", where D>=0, are selected. Hard decisions on bit 0 on each of the W competing paths and the ML path are compared. If the hard decisions are different, and if the path metric difference D is smaller than the previously saved soft decision of bit 0, the soft decision of bit 0 is updated by the path metric difference D. The soft decision of bit 0 is initialized by a maximum possible value or infinity $\infty$. In other words, the soft decision of bit 0 in log domain is $L_0=\min(D_w, D_{w-1}, \ldots, D_1)$ and the minimum function is only over the competing paths leading to a complementary bit decision of bit 0, that is, the discarded paths along the ML path which give a different decisions on bit 0 from the ML path. Thus, only the path metric differences at the ML survivor states are included in the above 'min' function. It will be appreciated that, with different path metric definition, the ML path can be the one with the largest path metric (e.g., correlation metric).

Thus, the hard and soft decisions on the leftmost windowed bit (window bit 0) is made at stage W. After the detector decisions are made for bit 0, the window is slid one bit or one trellis section to the right, so that information for that bit is discarded from the memory units. Thus, what was formerly bit 1 now becomes windowed bit 0 and the window encompasses a new trellis section W+1.

Figure 5:
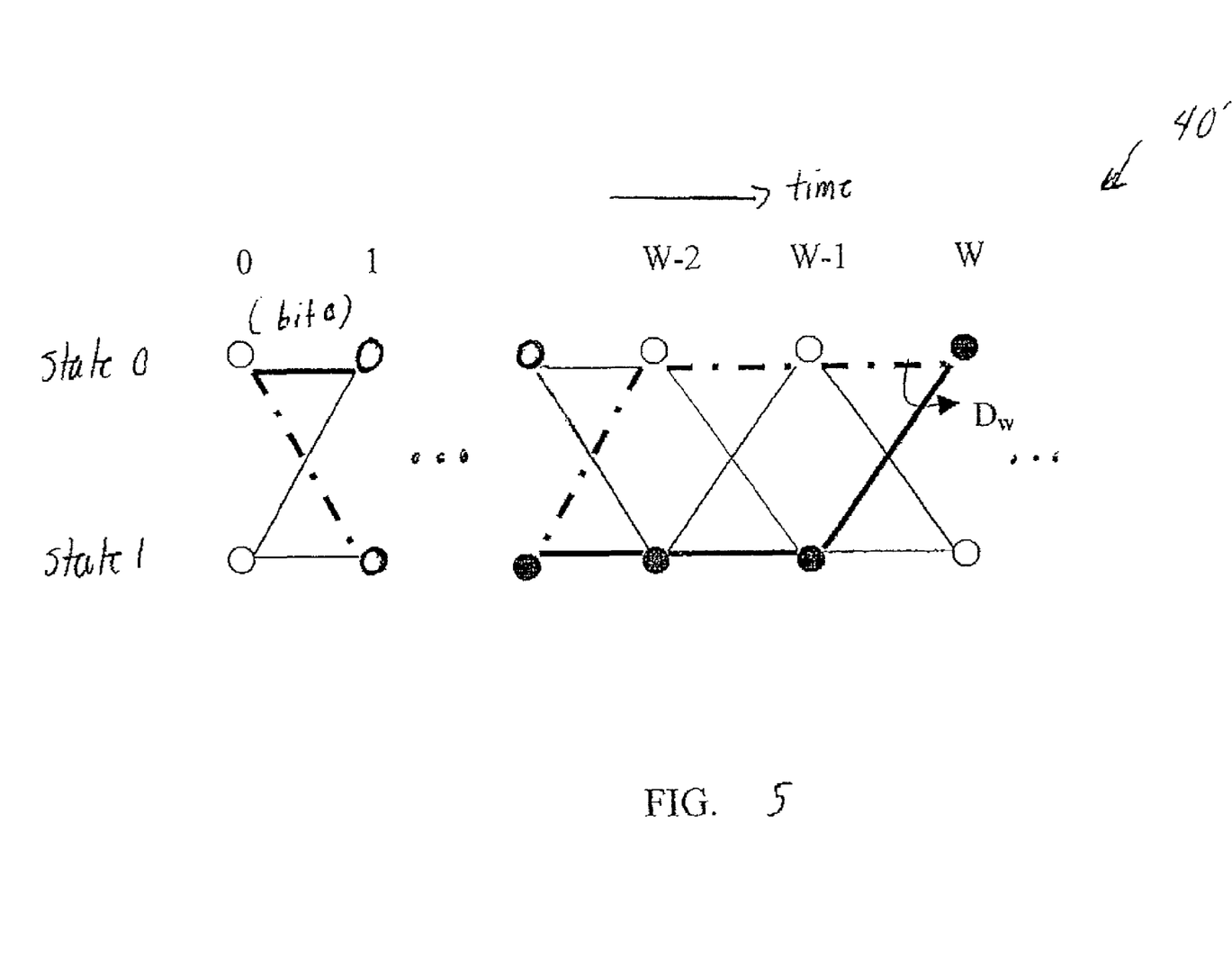
FIG. 5 is a depiction of an exemplary binary trellis showing a most likely (ML) path determined by the bit-level SOVA detector.

FIG. 5 partially illustrates operations performed in the SOEU 64 of the bit-level SOVA detector 50 with respect to trellis 40, shown here as trellis 40'. The illustrated operations example assumes that state 0 at time W is the best state, and the surviving path selectors are [(0,0), ..., (1,1), (0,1), (1,0)] for time 1 to W. The number of bits in each parenthesis is equal to the number of states. The last entry (1,0) says that branch 1 is the surviving branch to state 0, and branch 0 to state 1 at time W. The heavy solid branches and the shaded state nodes indicate the ML path and the ML survivor states, respectively. The hard decision on the ML path for bit 0 is 0. The dotted branches indicate the competing path merged with the ML path at time W and state 0. Since the hard decision based on the competing path for bit 0 is 1, the path metric difference $D_w$ is used to find the soft decision of bit 0. After all the competing paths along the ML path are considered, the soft decision of bit 0 is ready for output. Its hard decision is simply the input bit at time 0 on the ML path.

When soft and hard decisions for bit 0 are provided as outputs of the detector, the contents in the SPSU 56 and the PMDU 60 are shifted one position to the left to remove the information stored for bit 0, and information for time W+1 (bit W) is generated by ACSU 54 and stored in memory/register position W. The operations in the SOEU 64 are then repeated based on the new window data. Therefore, the total storage requirement in bits in the form of memory or registers is $2^m*W$ (for the SPSU 56)+$2^m*W*b$ (for the PMDU 60)+$2^m*b$ (the SMU 58), where b is the number of bits used to present state metrics or the path metric differences, typically FP values.

According to a bit-level SOVA, decisions on each bit i can be obtained after L trellis sections. With window size W>L, the decisions are reliable. Different implementations of the bit-level SOVA detector are possible and may result in different storage requirements and soft decision update schemes, see, for example, U.S. Pat. No. 6,445,755 B1, entitled "Two-Step Soft Output Viterbi Algorithm Decoder Using Modified Trace Back," in the name of Won-hee Chung, Jun-jin Kong, Tack-won Kwon, Dea-won Kim, Jun-rim Choi, as well as other references. The basic functional blocks remain as shown in FIG. 3 regardless of the specific implementation.

The symbol-level SOVA detector 12 (from FIG. 1) provides symbol-level soft value for each non-binary symbol in a data block based on the binary trellis of the bit-level SOVA detector 50. In one embodiment, the symbol-level soft values include the top two most likely symbol candidates (hard decisions) and their associated soft decisions.

Figure 6:
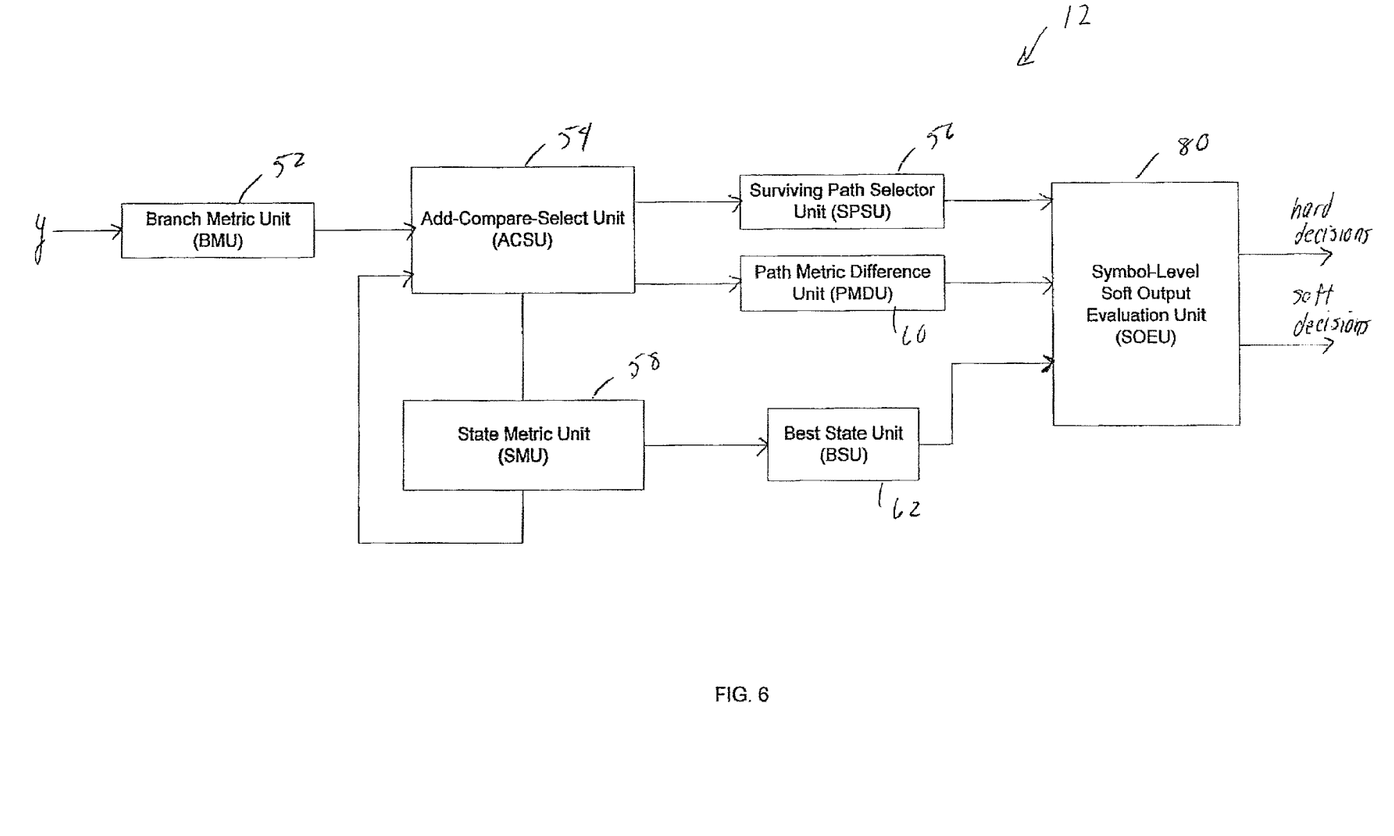
FIG. 6 is a block diagram of an exemplary symbol-level SOVA detector.

Referring to FIG. 6, the basic functional blocks of the symbol-level SOVA detector 12 are much the same as in the bit-level SOVA detector 50 (shown in FIG. 4) except that the bit-level SOEU 64 is replaced by a symbol-level SOEU 80. Also, the window size used by the symbol-level SOVA detector 80 is defined as W>L+Z, where Z is the non-binary symbol size in bits. If a symbol spans from bit i to i+Z−1, the symbol-level SOVA detector 80 proceeds until time i+Z+L before making a reliable decision on the symbol, hence the window size W≧L+Z. For ease of implementation, W may be selected as a multiple of Z.

Figure 7:
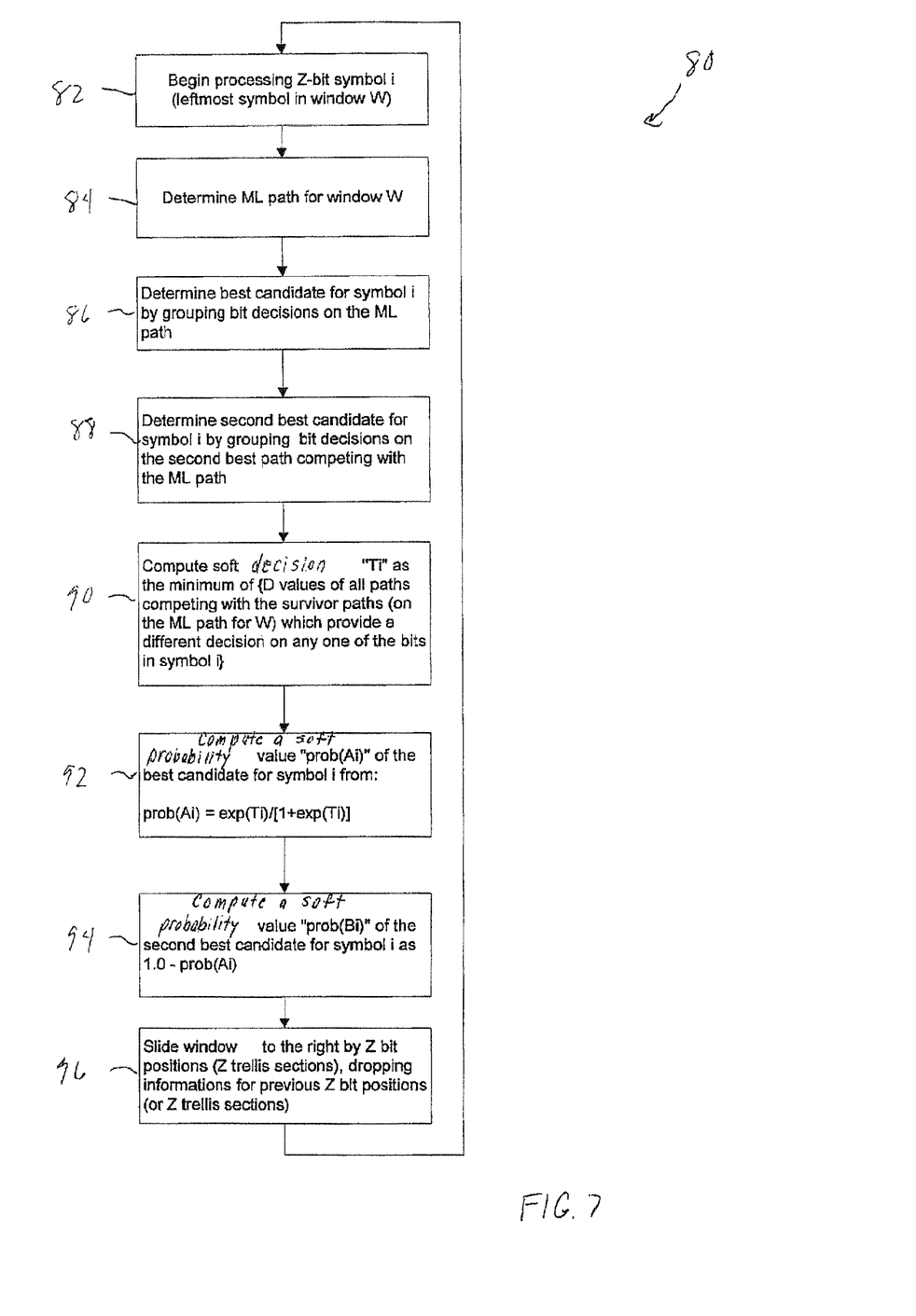
FIG. 7 is a flow diagram depicting operation of a soft output evaluation unit of the symbol-level SOVA detector (from FIG. 6), in one exemplary embodiment.

The operation of the symbol-level SOEU 80 of the symbol level SOVA detector 12 is illustrated in FIG. 7. At time W+iZ, the SOEU 80 begins processing symbol i (of Z-bits) (step 82) by determining the ML path for window W (step 84). The SOEU 80 determines the best candidate for symbol i, Ai, at time W+iZ by grouping bit decisions of the first Z input bits on the ML path (step 86). Next, to find the second best candidate for symbol i, Bi, the SOEU 80 groups the first Z bit decisions on the second best path that competes with the ML path. The second best path gives the smallest metric difference from the ML path among all of the competing paths along the ML path that give different hard decisions on at least one bit of the symbol i (from bit 0 to Z in the processing window at time W+iZ) when compared with the ML path (step 88). The SOEU 80 then computes a soft decision "Ti" as the minimum of the path metric differences D between the ML path and these competing paths (step 90). The soft decision Ti is equal to in (prob(Ai)/prob(Bi)), where prob(Ai) is the soft probability value for Ai and prob(Bi) is the soft probability value for Bi. If it is assumed that the probabilities of symbol i being Ai and Bi add to 1.0, then it follows that prob(Ai)=exp(Ti)/(1+exp(Ti)) and prob(Bi)=1−prob(Ai). Thus, SOEU 80 determines prob(Ai) of the best candidate Ai as 'exp(Ti)/(1+exp(Ti))' (step 92) and determines prob(Bi) of the second best candidate Bi as '1.0−prob(Ai)' (step 94).

After hard and soft decisions are made for symbol i, the SOEU 80 slides the processing window to the right by Z bit positions by controlling the contents in the SPSU and PMDU to be shifted Z bit positions to the left to remove stored information for time 1 to time Z (step 96). Thus, the window W is slid one symbol to the right after deciding the left-most symbol in the window.

In the following Z time units, the ACSU outputs Z sets of surviving path selectors and path metric differences to fill up the SPSU and PMDU. During that time, the SOEU 80 and the BSU 62 are idle. The SOEU 80 does not begin processing the next symbol i+1 until a complete window's worth of information is again available in the SPSU 56 and PMDU 60.

When the soft decoder of a non-binary ECC does not require soft values for all candidate symbols, or when only the top two candidates and their soft values suffice to provide the desired error performance, the symbol-level SOVA detector 12 can be used instead of the symbol-level MAP. For example, a soft decoder that uses the Generalized Minimum Distance (GMD) algorithm only requires the top candidate symbols, and the error performance of the Algebraic Soft Decoder (ASD) does not degrade much when it receives only the top two candidates and their soft decisions with high rate codes. Thus, for the case of a 10-bit symbol ECC, for example, the number of candidates generated for each symbol position, ideally 1024 candidates, would be reduced to two by the symbol-level SOVA detector, thus saving computational time and complexity (over existing symbol-level MAP solutions).

It should be noted that the symbol-level SOVA detector 80 can be devised based on any bit-level SOVA implementation. All that is necessary is that the architecture of the bit-level SOVA detector be sufficiently adapted to obtain the top two most likely symbols and their soft values based on the binary trellis.

Figure 8:
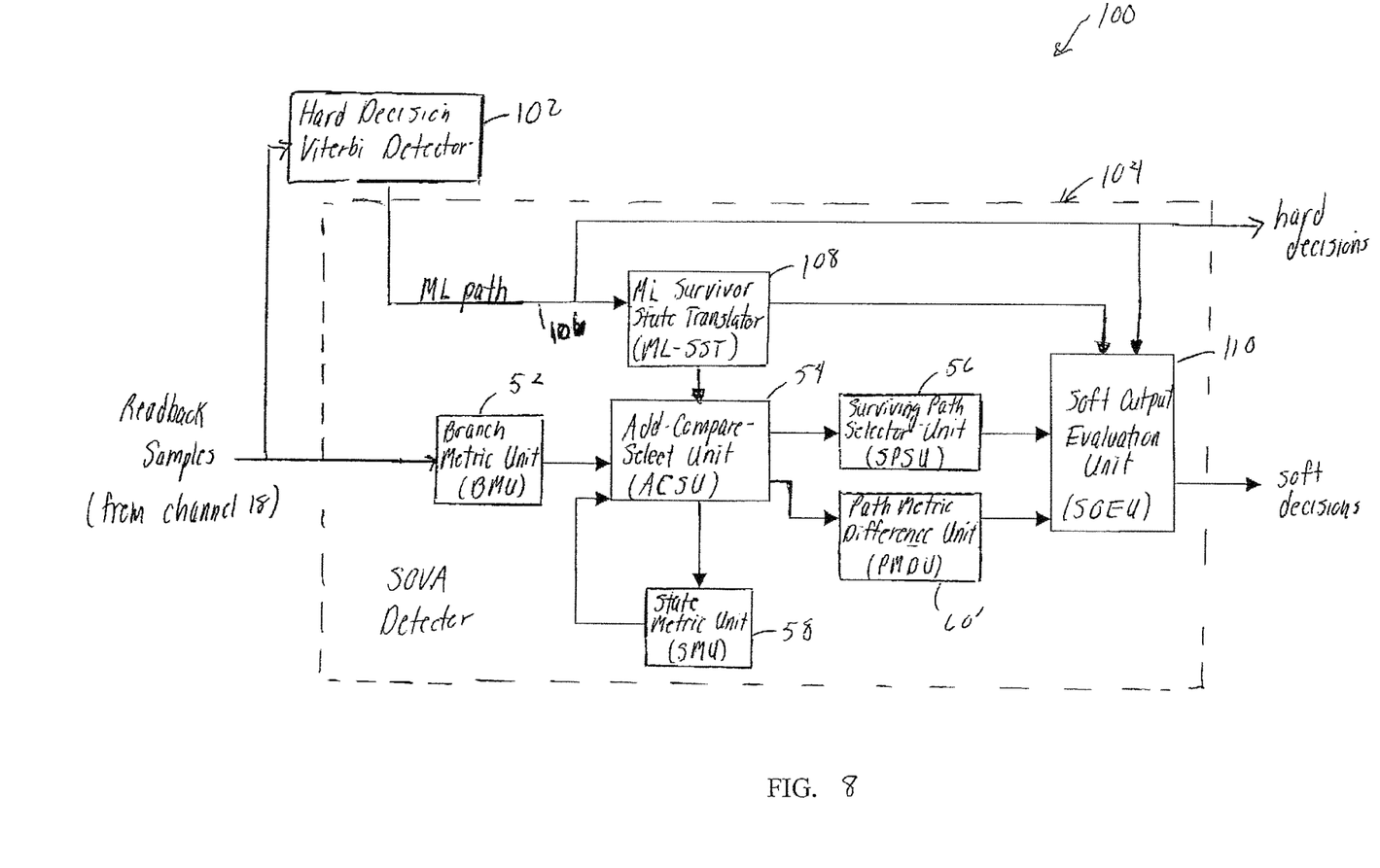
FIG. 8 is a block diagram of an exemplary simplified SOVA detector.

Both the bit-level and symbol-level SOVA detectors can be simplified when a hard decision Viterbi detector precedes the SOVA detector, as the ML path is available to the SOVA detector in such an arrangement. Referring to FIG. 8, a detector 100 includes a hard decision Viterbi detector 102 followed by a simplified SOVA detector 104. The simplified SOVA detector 100 still performs the BMU and ACSU processing through the trellis diagram using BMU 52 and ACSU 54 based on the received readback samples. The surviving path selectors for each state at each time are obtained from the ACSU 54 and stored in the SPSU 56, as before. In this SOVA detector implementation, however, the SOVA detector 104 receives an ML path input 106 from the preceding hard decision Viterbi detector 102, and uses an ML survivor state translator (ML-SST) 108 to obtain a sequence of ML survivor states from the ML path input. This sequence of ML survivor states is provided to an SOEU 110, which can be either a bit-level SOEU (like SOEU 64) or a symbol-level SOEU (like the symbol-level SOEU 80 illustrated in FIG. 7). The PMDU, indicated here by reference numeral 60', stores only the path metric differences at the ML survivor states. Referring back to the exemplary trellis 40' in FIG. 5, the ML survivor states at times W-2, W-1 and W are 1,1,0, which are the same as the corresponding input bits on the ML path.

In the SOEU 110, only the traceback operation for competing paths along the ML path is needed. The hard decisions are available directly from the ML path (via the ML-SST 108). The competing paths are compared with the ML path to decide whether their path metric difference from the ML path should be used for soft decision updates. The storage requirement in bits in the form of memory or registers in this simplified SOVA detector 104 is $2^m$*W*b (for SPSU 56)+W*b (for PMDU 60')+$2^m$*b (SMU). As mentioned earlier with reference to FIG. 4, this storage could be provided in an external memory device.

Figure 9:
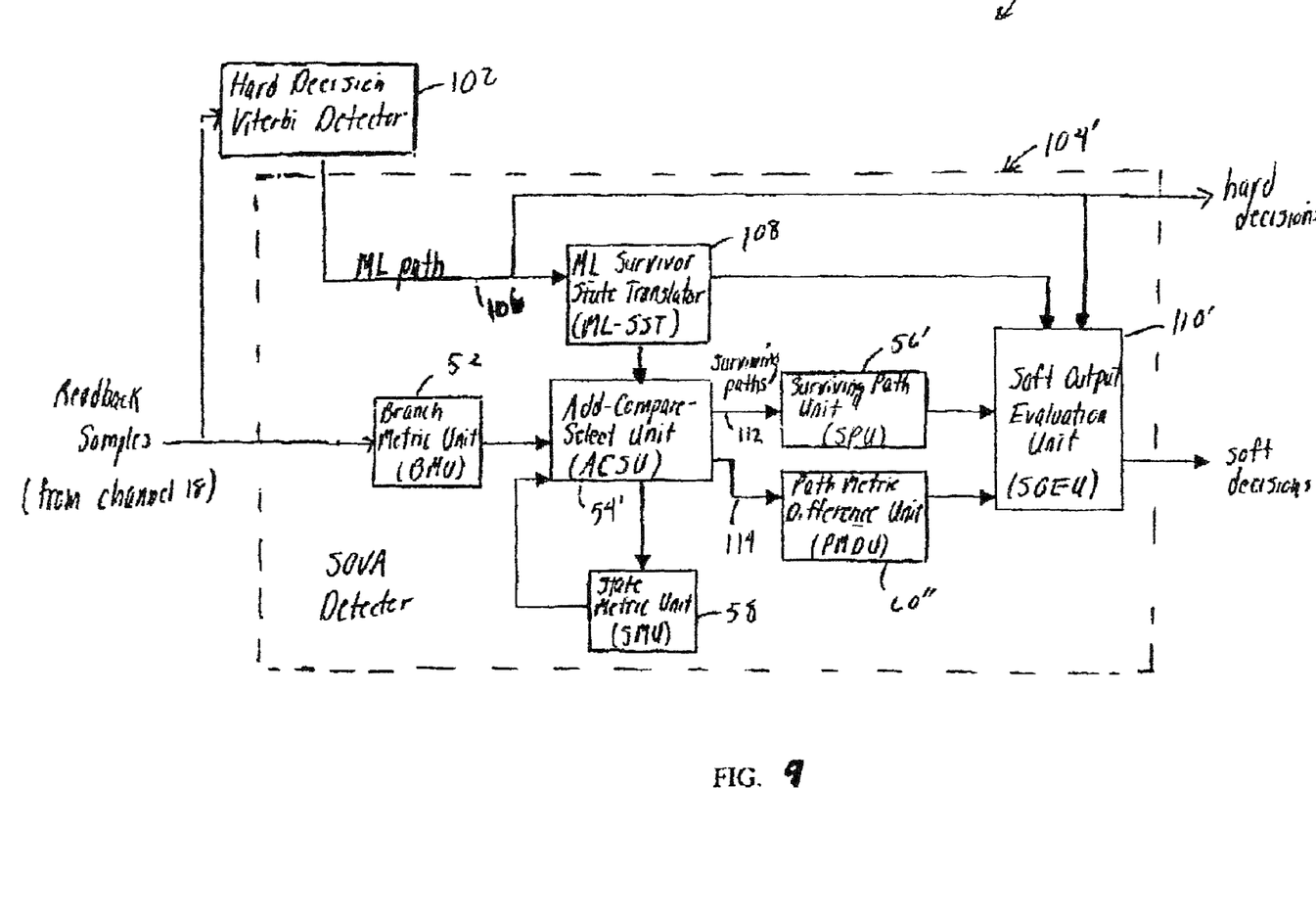
FIG. 9 is a block diagram of another exemplary simplified SOVA detector.

In an alternative embodiment of the detector 100, shown in FIG. 9 as detector 100', which includes a SOVA detector 104', surviving paths (the input bits along the paths) 112 for each state are stored in a surviving path unit or "SPU" (indicated by reference numeral 56') at time k instead of the surviving path selectors. At time k+1, ACSU 54' computes the state metrics for each state and the path metric difference at the current ML survivor state $D_{k+1}$. Instead of surviving path selectors, ACSU 54' directly outputs surviving paths (bit decisions) to the SPU 56'. An SOEU 110', with the ML survivor state at time k given and its competing state computed (uniquely defined by the ML survivor state and the channel target), compares the hard decisions on the competing path and the ML path without the trace back operation. The soft decision of the bit or symbol under consideration is updated based on the comparing result and $D_{k+1}$. The SPU 56' then updates the surviving paths for time k+1 based on the ACSU 54'. In this case, the trace back operation is completely eliminated, and only the path metric difference at the current time, current path metric difference 114, is stored in the PMDU, shown as PMDU 60". The SOEU 110' signals the ACSU 54' when the soft decision update is done, and the surviving paths stored in the SPU 56' can be updated. The storage requirements in bits is therefore reduced to $2^m*W*b$ (SPU)+b (PMDU)+$2^m*b$ (SMU). This storage could be provided in external memory device instead of the detector itself.

Figure 10:
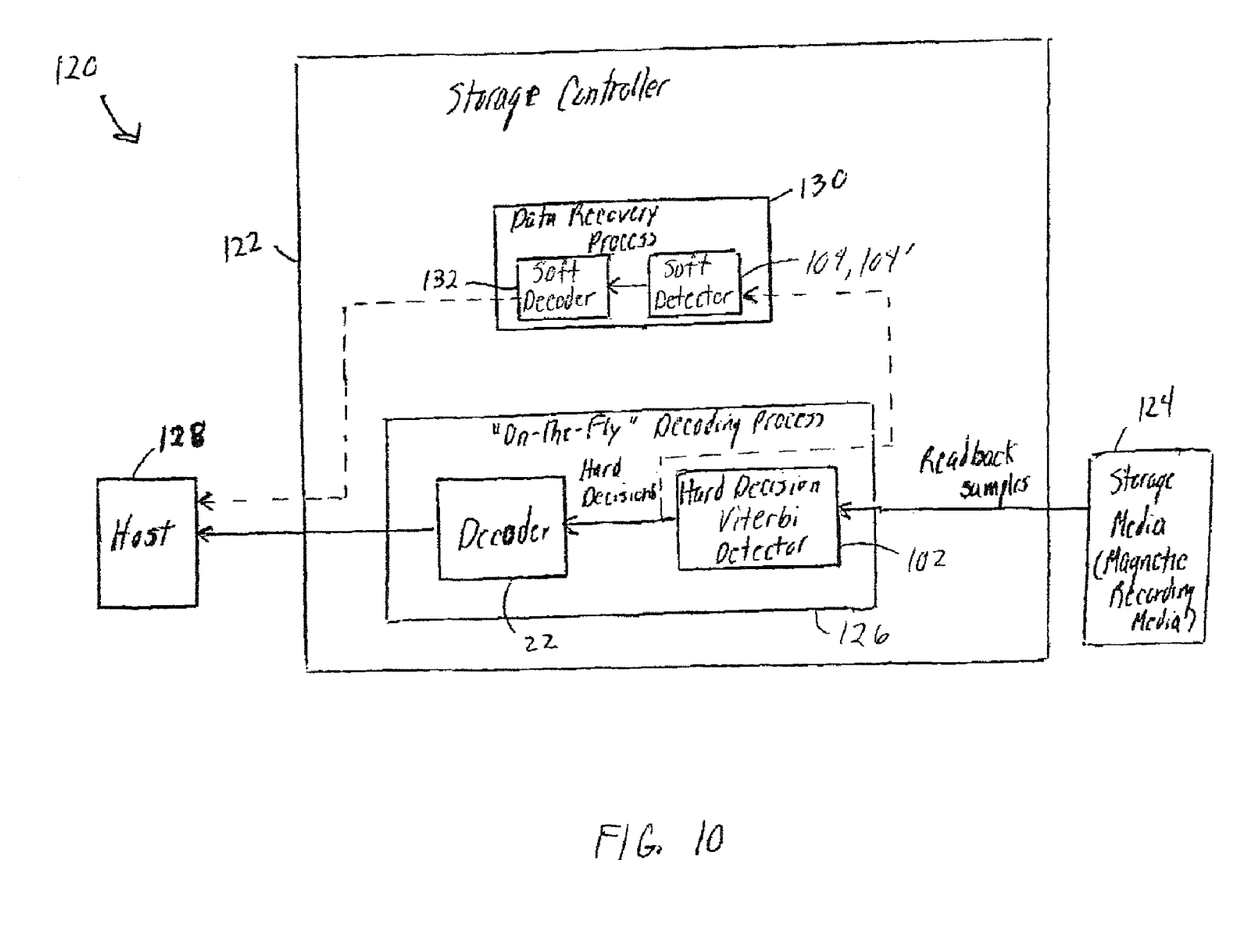
FIG. 10 is a block diagram of a system that uses a SOVA detector like the SOVA detector shown in FIGS. 8 and 9 for data recovery.

It will be understood that the SOVA detector 104 and 104' could be used for either "on-the-fly" decoding, as illustrated in FIGS. 8 and 9, or data recovery. FIG. 10 shows a system 120 that employs the SOVA detector for data recovery. Referring to FIG. 10, the system 120 includes a storage controller 122 that reads information from storage media 124, performs a decoding operation on the read information using an "on-the-fly" decoding process 126 and provides results to a requestor, e.g., a host 128. The "on-the-fly" decoding process can be performed by the hard decision Viterbi detector 102 followed by the decoder 22. In the event that the decoding 126 is unsuccessful, or a number of retry attempts by the decoding process 126 fail, the storage controller 122 can use a more extensive data recovery process 130 to decode the information. As shown, the data recovery process 130 can include a SOVA detector, which can be the functional equivalent of the SOVA detector 104 (FIG. 8) or SOVA detector 104' (FIG. 9), and a soft decoder 132, such as GMD or ASD decoder. As indicated by the dashed arrows, when the data recovery process 130 is utilized, the output of the hard decision Viterbi detector 102 is provided to the input of the soft detector 104, 104', and the output of the soft decoder 132 is provided to the host 128. The decoding process 126 can be implemented in hardware and the data recovery process 130 can be implemented in software.

Other embodiments are contemplated as well. For example, the symbol-level SOVA may be adapted for use in other applications, including coding with memory, e.g., convolutional codes. For example, to support an 'n/m' rate convolutional code would require that m noisy samples and n user bits per branch be considered.

It is to be understood that while the invention has been described in conjunction with the detailed description thereof, the foregoing description is intended to illustrate and not limit the scope of the invention, which is defined by the scope of the appended claims.

All publications and references cited herein are expressly incorporated herein by reference in their entirety.

What is claimed is:

1. A detector comprising:
   a hard decision Viterbi detector to determine hard decisions for non-binary symbols in a code-word; and
   a SOVA (soft output Viterbi algorithm) detector, coupled to the hard decision Viterbi detector, to receive most likely path information from the hard decision Viterbi detector and use the most likely path information to determine corresponding soft values.

2. The detector of claim 1 wherein the S OVA detector maintains surviving paths for each of a plurality of states at time k and at time k+1 computes state metrics for each of a plurality of states and a path metric difference at a current most likely survivor state to update surviving paths for time k+1.

3. The detector of claim 1 wherein the SOVA performs trace back operations only for competing paths along a most likely path.

4. The detector of claim 3 wherein the SOVA detector compares path metrics for the competing paths to determine which path metric difference to use for soft value updates.

5. The detector of claim 4 wherein only a current path metric difference is maintained for each hard decision.

6. The detector of claim 4 wherein the corresponding soft values form the non-binary symbols and only a current path metric difference are maintained for each of the non-binary symbols.

7. The detector of claim 1 wherein the SOVA detector
   determines from the output of the Viterbi detector a sequence of most likely survivor states, and
   maintains only path metric differences at the respective most likely survivor states.

8. A method comprising the steps of:
   using a hard decision Viterbi detector to determine hard decisions for non-binary symbols in a codeword; and
   using a SOVA (soft output Viterbi algorithm) detector to receive most likely path information from the hard decision Viterbi detector and use the most likely path information to determine corresponding soft values.

9. The method of claim 8 wherein the SOVA detector further maintains surviving paths for each of a plurality of states at time k and at time k+1 computes the of a plurality of states metrics for each state and a path metric difference at a current most likely survivor state to update the surviving paths for time k+1.

10. The method of claim 8 wherein the SOVA detector performs trace back operations only for competing paths along a most likely path.

11. The method of claim 10 wherein the SOVA detector compares path metrics for the competing paths to determine which path metric difference to use for soft value updates.

12. The method of claim 11 wherein only a current path metric difference is maintained for each hard decision.

13. The method of claim 11 wherein the corresponding soft values form the non-binary symbols and only a current path metric difference are maintained for each of the non-binary symbols.

14. The method of claim 8 wherein the SOVA detector
   determines from the output of the Viterbi detector a sequence of most likely survivor states, and
   maintains only path metric differences at the respective most likely survivor states.

* * * * *